United States Patent
McMullen

(10) Patent No.: US 10,712,405 B2
(45) Date of Patent: Jul. 14, 2020

(54) EXTERNAL AIR CORE FLUX MEASUREMENT SYSTEM FOR A PRODUCTION MAGNETIZING SYSTEM

(71) Applicant: A. Todd McMullen, Fishers, IN (US)

(72) Inventor: A. Todd McMullen, Fishers, IN (US)

( * ) Notice: Subject to any disclaimer, the term of this patent is extended or adjusted under 35 U.S.C. 154(b) by 339 days.

(21) Appl. No.: 15/197,628

(22) Filed: Jun. 29, 2016

(65) Prior Publication Data

US 2017/0082700 A1 Mar. 23, 2017

Related U.S. Application Data

(60) Provisional application No. 62/187,037, filed on Jun. 30, 2015.

(51) Int. Cl.
*G01R 33/12* (2006.01)
*H01F 13/00* (2006.01)

(52) U.S. Cl.
CPC ......... *G01R 33/1215* (2013.01); *H01F 13/00* (2013.01)

(58) Field of Classification Search
None
See application file for complete search history.

(56) References Cited

U.S. PATENT DOCUMENTS

| | | |
|---|---|---|
| 3,088,528 A | 5/1963 | Patton et al. |
| 3,602,811 A | 8/1971 | Fales |
| 3,947,533 A | 3/1976 | Davis |
| 4,492,920 A | 1/1985 | Reenstra |
| 4,497,011 A | 1/1985 | Hurting |
| 4,724,601 A | 2/1988 | MacManus et al. |
| 4,782,437 A | 11/1988 | Nishiyama et al. |
| 4,991,098 A | 2/1991 | Dantzler |
| 5,410,244 A * | 4/1995 | Draves ............ G01D 11/00 324/140 R |
| 5,686,832 A * | 11/1997 | Ayres ............ G01R 7/06 324/144 |
| 6,009,756 A | 1/2000 | Williams et al. |
| 6,225,727 B1 | 5/2001 | Oohashi et al. |
| 6,384,592 B1 * | 5/2002 | Sylvester ............ G01R 7/06 324/144 |
| 6,454,911 B1 * | 9/2002 | Xu ............ G01R 33/10 118/712 |
| 6,456,059 B1 | 9/2002 | Blakely |
| 8,169,213 B2 | 5/2012 | Shimamura et al. |
| 2006/0219497 A1 | 10/2006 | Organek et al. |
| 2009/0009012 A1 | 1/2009 | Stephens et al. |

* cited by examiner

*Primary Examiner* — Nasima Monsur
(74) *Attorney, Agent, or Firm* — John D Ritchison; Ritchison Law Offices, PC

(57) ABSTRACT

An external "Air Core" Flux Measurement System for a production magnetizing system/devices which is a an application of magnetic energies and the respective energies of a magnetizing coil and measurement system for the efficient production of coils for automotive and other industries and a system for evaluating the quality of the cores and magnetic charge after magnetization. This is an air core meter with gauges driven by a dedicated circuit. The present invention provides a method and apparatus for the testing of coils with an air core separate from the magnetization step to eliminate errors and other distracting signals inherent to the measurement device when combined with the core magnetizing step.

6 Claims, 14 Drawing Sheets

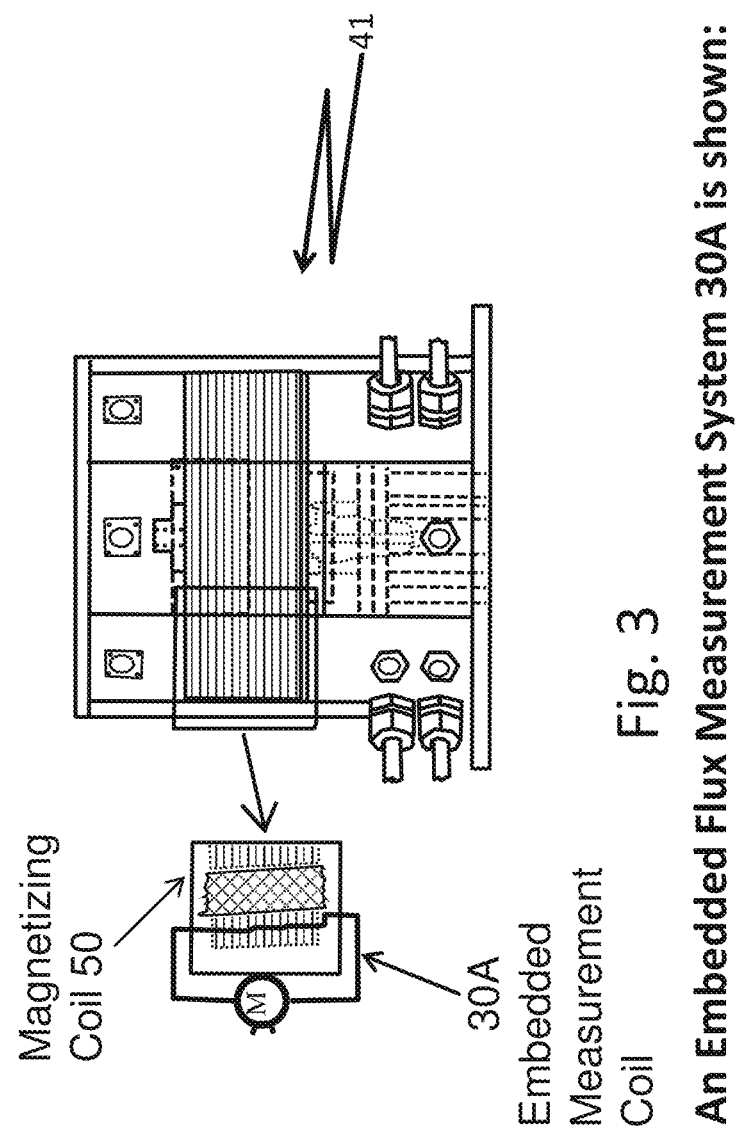

Air Core Design 30 has the instrumentation coil separated from the magnetizing coil.

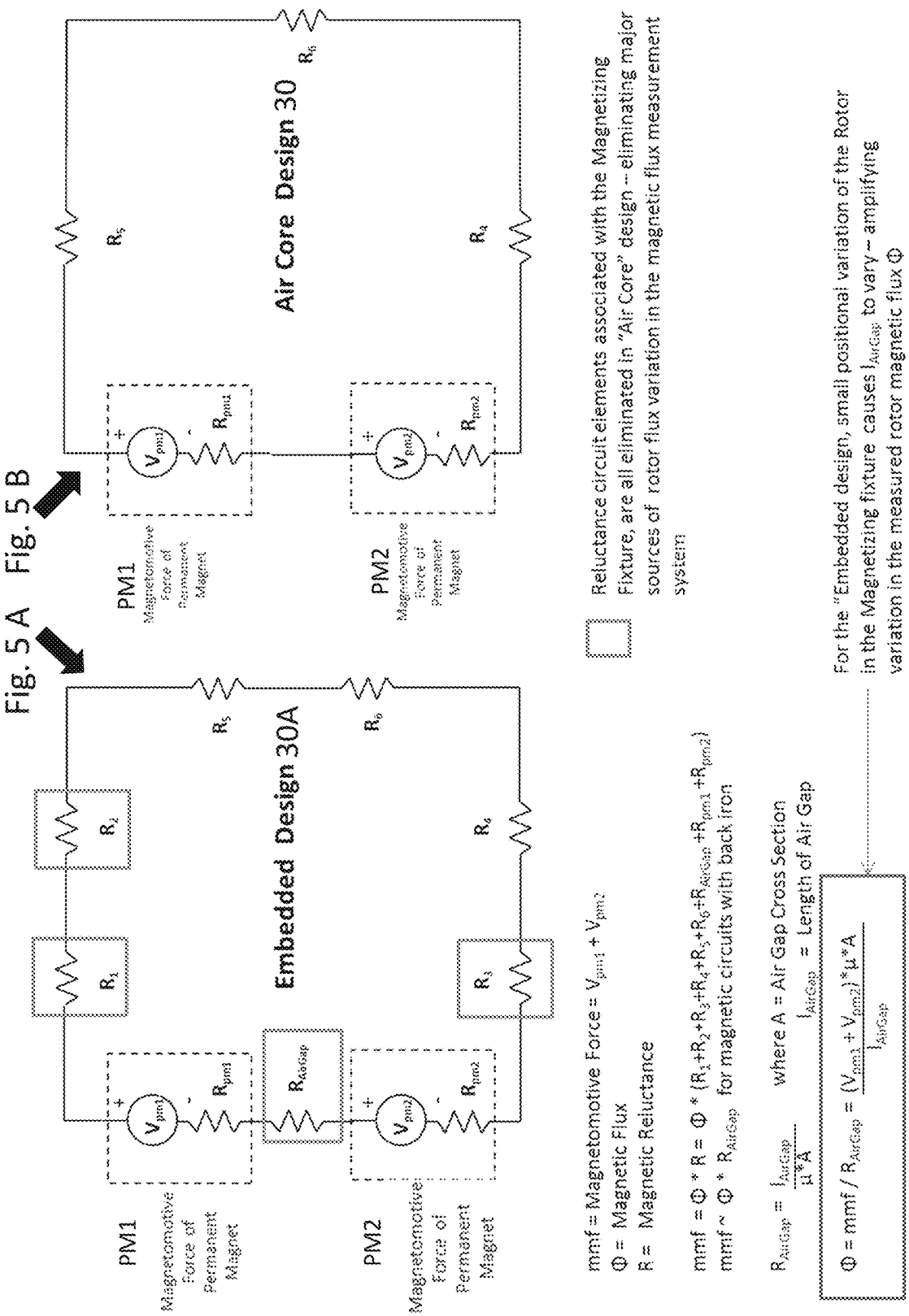

Initial Flux Measurement Results with Embedded Coil

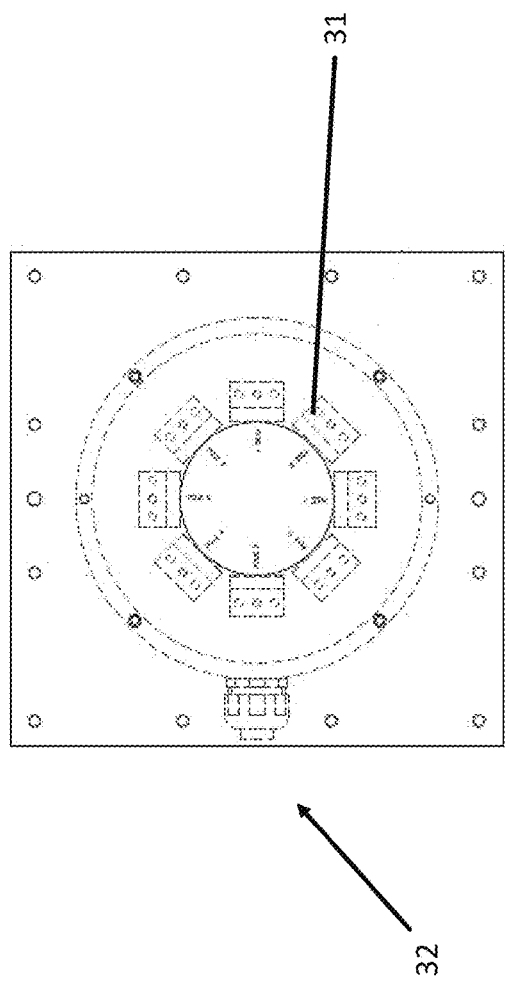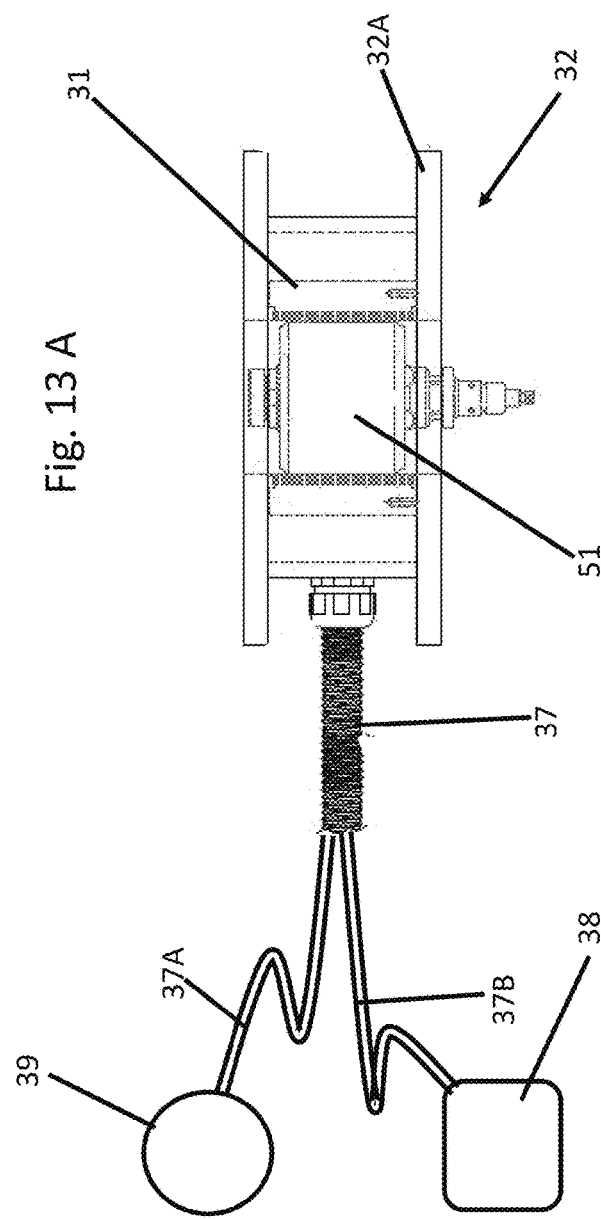

EXTERNAL AIR CORE FLUX MEASUREMENT SYSTEM FOR A PRODUCTION MAGNETIZING SYSTEM

CROSS-REFERENCE TO RELATED APPLICATIONS

This application claims the benefit of United States Provisional Patent Application with Ser. No. 62/187,037 filed Jun. 30, 2015 by A. Todd McMullen and entitled "An external "Air Core" Flux Measurement System for a production magnetizing system".

FIELD OF INVENTION

The present invention relates to an external "Air Core" Flux Measurement System for a production magnetizing system/devices. More particularly, the present invention relates to the application of magnetic energies and to the application of the respective energies of a magnetizing coil and measurement system for the efficient production of coils for the automotive and vehicle industry plus the manner, method and system for evaluating the quality of the cores and magnetic charge after magnetization for various industries. This invention relates generally to electrical indicators, and more particularly to an air core meter.

The invention relates to a device for testing ferromagnetic materials and coils using at least one electromagnetic coil in connection with a magnetic field at least one magnet system producing the magnetic field. This invention further relates to an electrical measuring device for measuring a condition of coil windings through which currents are measured and controlled to check and evaluate the force within the magnetic field. Herein the air core gauges are driven by a dedicated circuit which energizes the coils to develop predetermined current levels and compare to a predetermined value. The present invention provides a method and apparatus for the testing of coils with an air core separate from the magnetization step to eliminate errors and other distracting signals inherent to the measurement device when combined with the core magnetizing step.

FEDERALLY SPONSORED RESEARCH

None.

SEQUENCE LISTING OR PROGRAM

None.

BACKGROUND—FIELD OF INVENTION AND PRIOR ART

As far as known, there are no other external "Air Core" Flux Measurement System for a production magnetizing system. It is believed that this system/product is unique in its design and technologies. The subject matter disclosed herein relates generally to electrical machines, particularly to electrical machines having permanent magnet type rotors. Specific embodiments relate to an assembly and method for magnetization of permanent magnet segments in such rotors.

BACKGROUND OF THE INVENTION

Electrical gauges of the type used as indicator meters in processing electrical coils frequently are driven solely by electrical signals representing the parameter being measured. It is considered to be desirable, however, to positively bias the meter to a zero indication when the ignition is turned off to avoid the impression that the gauge is unreliable or that the measured parameter has the indicated value.

Problem Addressed

Benchmarking of other Flux Measurement Systems for a production magnetizing system revealed the following industry standard methods and shortfalls:
1) Employing an Embedded Flux Measuring Coil design that provided an all in one package for Magnetizing and Measuring in a single Casing.
2) Gross overall Flux Measurement across all poles was the primary discriminant for Quality and Correlation to Motor Back EMF and Torque Output.
3) Flux Measurement Capability data was not readily available that demonstrated GR&R correlation to Motor Back EMF and Defect detection linked to realistic Process Failure Modes.

[Gage R&R, which stands for gage repeatability and reproducibility, is a statistical tool that measures the amount of variation in the measurement system arising from the measurement device and the people taking the measurement. Motor Back EMF is the ratio of generated output voltage to driven speed.]

Problem Solved

The measuring concept of the present external "Air Core" Flux Measurement System addressed all these concerns by:
a. A Separate Air Core Flux Measuring design that separates the Measuring Coil from the Magnetizing Coil casing.
b. In depth studies validated that the main sources of variation from the Industry standard 'Embedded' design were:
Temperature resulting from the Charge/Discharge of high current through the Magnetizing Coils
Residual Flux bias resulting from the Magnetization cycle
Sensitivity to slight Mechanical Fixture Misalignment
These sources of variation were all minimized or eliminated in the new 'Air Core' design.

Prior Art

None of the prior art devices provide a simple and efficient external "Air Core" Flux Measurement System for a production magnetizing system like the present device/system. In view of the above, it will be appreciated that there exists a need for an improved production magnetizing system with an external "Air Core" Flux Measurement System which overcomes the disadvantages of the prior art devices, particularly the disadvantages noted within. Prior art discovered as in the same field but not solving the problems are: U.S. Pat. No. 3,947,533 in 1976 by Davis entitled "Magnetic field expansion and compression method". Here is shown a method of altering the physical properties of materials by applying to the materials in their fluid states the magneto magnetic energy of the north and/or south pole of a magnet. Application of the magnetic north pole to molten metal causes the cooled metal to exhibit a smoother, finer surface, a finer grain structure and increased break strength.

The next prior art found is a "Switching apparatus for changing the absolute value and the permanent magnetization direction of ferromagnetic bodies, e.g. of permanent magnets" as U.S. Pat. No. 4,497,011 issued to Hurtig in 1985. It shows a switching unit for changing the polarity or the magnetic field-strength of ferromagnetic bodies, for example of permanent-magnet clamping devices, possesses a series-arrangement comprising at least one coil which is suitable for receiving ferromagnetic bodies, a controllable electronic switch, and an energy-storage system. The object is to provide a compact switching unit which switches reliably and which possesses a simple electrical circuit. This object is achieved by means of a switching unit which comprises an electronic switch, in the in the form of a flash lamp. Next a device entitle "Device for testing ferromagnetic materials as U.S. Pat. No. 6,009,756 issued to Willems, et al. in 2000 shows a "Device for testing ferromagnetic materials, such as pipelines and the like, for faults, cracks, corrosion, etc. An one electromagnetic ultrasonic transducer includes at least one high frequency current coil and an array of permanent magnets which create a magnetic field for exciting and/or detecting ultrasonic waves in the wall of the ferromagnetic material. The ultrasonic transducer is located between the pole pieces of an additional magnet arrangement that it produces".

Another prior art device is non-homogeneous material magnetic flux sensor and method [m U.S. Pat. No. 6,456,059 issued to Blakely in 2002. It teaches a sensor comprises a magnetic flux divider and a winding. The magnetic flux divider comprises first and second magnetic paths through which magnetic flux flows. The magnetic flux divider divides the magnetic flux between the first and second magnetic paths as a function of a total amount of magnetic flux flowing through the magnetic flux divider. The winding produces a signal that is indicative of the total amount of magnetic flux flowing through the flux divider based on the operation of the flux divider. A method of sensing a parameter comprises providing a material with a permeability that varies in accordance with an amount of magnetic flux passing through the material; and acquiring information indicative of the permeability of the material, the permeability of the material being indicative of the parameter. The sensor and method can be utilized to acquire information pertinent to another parameter of ultimate interest, such as information pertaining to a current flow in an electrical circuit. Then a prior art is a "Magnetic field analysis method, magnetization analysis device, and recording medium with computer program" issued as U.S. Pat. No. 8,169,213 issued to Shimamura, et al. in 2012. Here is taught a method to perform accurate magnetization analysis by considering the magnetic state of an incomplete magnetic region. A magnetization analysis device performs magnetization analysis by using a magnetizer parameter associated with a magnetizer and a magnet parameter associated with a magnet material so as to calculate a magnetization magnetic field applied to respective portions of the magnet material (S17), calculates a recoil ratio permeability and a coercivity as region of a permanent magnet as an analysis object for the respective portions according to the calculation result of the magnetized magnetic field and the demagnetization curve associated with the incomplete magnetization region actually measured in advance (S18), and performs a magnetic field analysis by using the calculation result of the region parameter so as to calculate a state parameter indicating the magnetized state of the permanent magnet as an analysis object (S19).

Then is an "ELECTRICAL MEASURING DEVICE" as U.S. Pat. No. 3,602,811 issued to Fales in 1971. Here is shown an electrical measuring device for measuring the rate of occurrence of an event or the magnitude of some quantity at a remote point having two coil windings, the currents through which are controlled in a manner such that the current through the first coil winding decreases with an increase in the magnitude of the condition being measured, and the current through the second coil winding increases with a decrease in the current through the first coil winding, and a compensation network to provide for maximum accuracy in a relatively inexpensive mechanism. Further is a "Computer-based controller and bipolar PWM driver arrangement for air core gauge control" issued as U.S. Pat. No. 4,991,098 to Dantzler in 1991. This patent teaches a control arrangement including a computer-based controller and bipolar driver for bidirectional current control of air core gauge coils by pulse-width-modulation (PWM). The computer-based controller processes input information to determine the desired deflection of the pointer, and looks-up previously stored PWM duty cycle commands for energizing the gauge coils. The bipolar drivers modulate the polarity of the voltage applied to the coils in accordance with the duty cycle commands. Since the drivers are bipolar, a zero strength magnetic field vector is achieved with a duty cycle command of 50 percent. This eliminates discontinuities in the region of zero strength magnetic field vector, and avoids the requirement of generating duty cycles of 0 percent and 100 percent to achieve a full 360 degrees of pointer deflection. Potential discontinuities in the generation of the duty cycles due to input data processing requirements is eliminated by scaling the duty cycles.

Next a "Wye winding radial air-core gauge system" as U.S. Pat. No. 5,004,976 was issued to Markow, et al. in 1991 that shows a "wye-type air-core gauge system provides magnitude indications of measured and is in response to PWM signals generated by a control unit that receives electrical signals from a sensor that represents magnitude variations of the measured and. The size of the stator coils of the gauge makes possible a very low profile gauge suitable for mounting in an instrument cluster+. After that an "Air core gauge testing method and apparatus utilizing magnetic coupling between gauge coils" was issued as U.S. Pat. No. 5,410,244 Draves in 1995. It shows a method for testing gauges includes applying a rotation signal to the gauge. An AC input signal is superimposed on a first coil of the gauge. A second coil of the gauge is monitored to detect a coupled AC output signal. The rotational signal is varied while the AC output signal is monitored. The operational status of the gauge is determined responsive to the AC output signal and a process output signal indicative of the operational status is provided.

An "Electric indicator with return-to-zero feature and compensating coil to cancel the return-to-zero feature during measurement" was issued as U.S. Pat. No. 4,492,920 issued to Reenstra in 1985. It demonstrates an air core meter movement having return-to-zero means. Permanent magnets mounted within the deflection coils provide a field which interacts with the rotor magnet to return the pointer to zero when no power is applied to the meter. A compensating coil is also included to counteract the effects of the permanent magnets when measurable signals are applied to the deflection coils. Next a method of manufacturing a return-to-zero gauge was issued as U.S. Pat. No. 4,724,601 to MacManus, et al. in 1988. Here is described an air core electrical gauge incorporates on the bobbin an annular biasing magnet magnetized in a direction to return the meter pointer to zero in the absence of a gauge driving current. A method of manufacturing the gauge includes magnetizing the biasing magnet after it is secured to a bobbin portion but optionally magnetizing the gauge armature at the same time.

After these prior art references is a "Magnetic material biasing method and apparatus" issued as U.S. Pat. No. 4,782,437 to Nishiyama, et al in 1988. It describes and shows an apparatus such as a transformer comprising at least a magnetic core and a main winding, a method and apparatus for biasing of a magnetic material is characterized in that an auxiliary winding N2 is added to said magnetic core 2 and a predetermined amount of demagnetizing current, which will reduce the magnetic flux caused by said main winding N1 by a predetermined amount, is caused to flow through said auxiliary winding N2 in synchronism with an increase in the magnetic flux caused by said main winding N1 to prevent the magnetic saturation of the magnetic core during the time that the magnetic flux caused by the main winding is increasing. After this, a "Rotor for dynamo-electric machine and method for magnetizing magnetic bodies thereof" was issued as U.S. Pat. No. 6,225,727 to Oohashi, et al in 2001. Here is described a rotor for a dynamo-electric machine includes a rotor coil, a first pole core body disposed so as to cover the rotor coil formed with a plurality of first claw-shaped magnetic poles evenly spaced around a circumferential portion thereof being magnetized by magnetic flux, a second pole core body disposed facing the first pole core body having second claw-shaped magnetic poles spaced so as to intermesh between the first claw-shaped magnetic poles, a first magnetic body secured to the first pole core body which is magnetized in directions which reduce magnetic flux leakage with the second claw-shaped magnetic poles at each side surface of the first claw-shaped magnetic poles, and a second magnetic body secured to the second pole core body facing the first magnetic body across an air gap which is magnetized in directions which reduce magnetic flux leakage with the first claw-shaped magnetic poles at each side surface of the second claw-shaped magnetic poles.

A "Residual magnetic devices and methods" was published and shown in Patent Application published as 20060219497 for Organek, et al in 2006. It demonstrated a residual magnetic locks, brakes, rotation inhibitors, clutches, actuators, and latches. The residual magnetic devices can include a core housing and an armature. The residual magnetic devices can include a coil that receives a magnetization current to create an irreversible residual magnetic force between the core housing and the armature. Another publication was entitled "ASSEMBLY AND METHOD FOR MAGNETIZATION OF PERMANENT MAGNET ROTORS IN ELECTRICAL MACHINES" and published as 20090009012 to Stephens, et al in 2009. This shows a magnetizer for a rotor of an electrical machine is provided. The magnetizer includes a magnetizing yoke and coils wound around the magnetizing yoke. The magnetizing yoke includes multiple pole-pieces extending therefrom, and at least some of the pole-pieces include a cobalt alloy.

Further art is described in "MAGNETIC ORIENTATION OF SAMPLES OF EARTH MATERIAL" in U.S. Pat. No. 3,088,528 issued to Patton, et al. in 1963. Here is taught an invention that relates to the taking of samples of material from the earth and relates more particularly to means for magnetically orienting the samples of earth material with respect to their original position in the earth. Shown are samples of material are taken from the earth for various purposes. For example, samples of material are taken from the earth in order to obtain information concerning the chemical or physical characteristics of the earth material at the point of sampling. These characteristics of the earth materials can be anisotropic. In many instances, the information desired requires a knowledge of the spatial position, or orientation, which the sample had in the earth.

SUMMARY OF THE INVENTION

The present invention is generally directed to a production magnetizing system with an external "Air Core" Flux Measurement System. The preferred embodiment of the external "Air Core" Flux Measurement System/device 30 for a production magnetizing systems 40 comprising: An Instrumentation coil 31 for flux measurement, the instrumentation coil 31 being separate from a magnetizing coil 50 in a production magnetizing systems 40; a Magnetizing flux gauge 32 combined with a fixture to hold a rotor (coil) 51 to be measured and the instrumentation; a power connection to power source 38 and control wiring to the instrumentation 39; the power source 38; and the instrumentation 39.

Objects and Advantages

There are several objects and advantages of an external "Air Core" Flux Measurement System for a production magnetizing system. There are currently no devices or systems that are effective at providing the objects of this invention.

| Item | Advantages |
|---|---|
| 1 | Provides Flux Measurement Capability data that demonstrated GR&R correlation to Motor Back EMF and Defect detection linked to realistic Process Failure Modes |
| 2 | Minimize or eliminate the effect of Temperature resulting from the Charge/Discharge of high current through the Magnetizing Coils |
| 3 | Minimize or eliminate the effect of Residual Flux bias resulting from the Magnetization cycle |
| 4 | Minimize or eliminate the effect of Sensitivity to slight Mechanical Fixture Misalignment |

Finally, other advantages and additional features of the present system of the external "Air Core" Flux Measurement System for a production magnetizing system/device will be more apparent from the accompanying drawings and from the full description of the device. For one skilled in the art of magnetizing and measurement systems, it is readily understood that the features shown in the examples with this system and combination of components are readily adapted to other types of systems or devices for magnetizing and measurement assists.

DESCRIPTION OF THE DRAWINGS—FIGURES

The accompanying drawings, which are incorporated in and constitute a part of this specification, illustrate an embodiment of the external "Air Core" Flux Measurement System for a production magnetizing system/device that is preferred. The drawings together with the summary description given above and a detailed description given below serve to explain the principles of the production magnetizing system with the external "Air Core" Flux Measurement System for a production magnetizing system/devices. It is understood, however, that the system is not limited to only the precise arrangements and instrumentalities shown.

FIGS. 1 A through 1 E are sketches of the general production magnetizing system with an embedded "Air Core" Flux Measurement System/Process FIG. 1 A; schematic of the embedded and combined magnetizing and measurement system FIG. 1 B; isometric of the manufacturing equipment FIG. 1 C; schematic of the separated magnetizing and measurement system FIG. 1 D; and the equivalent magnetic circuits for both the embedded and separate air coil rotor flux measurement system FIG. 1 E.

FIG. 3 is a sketch/schematic of the combined and embedded magnetizing and measurement system with components and features noted.

Figure 4B:
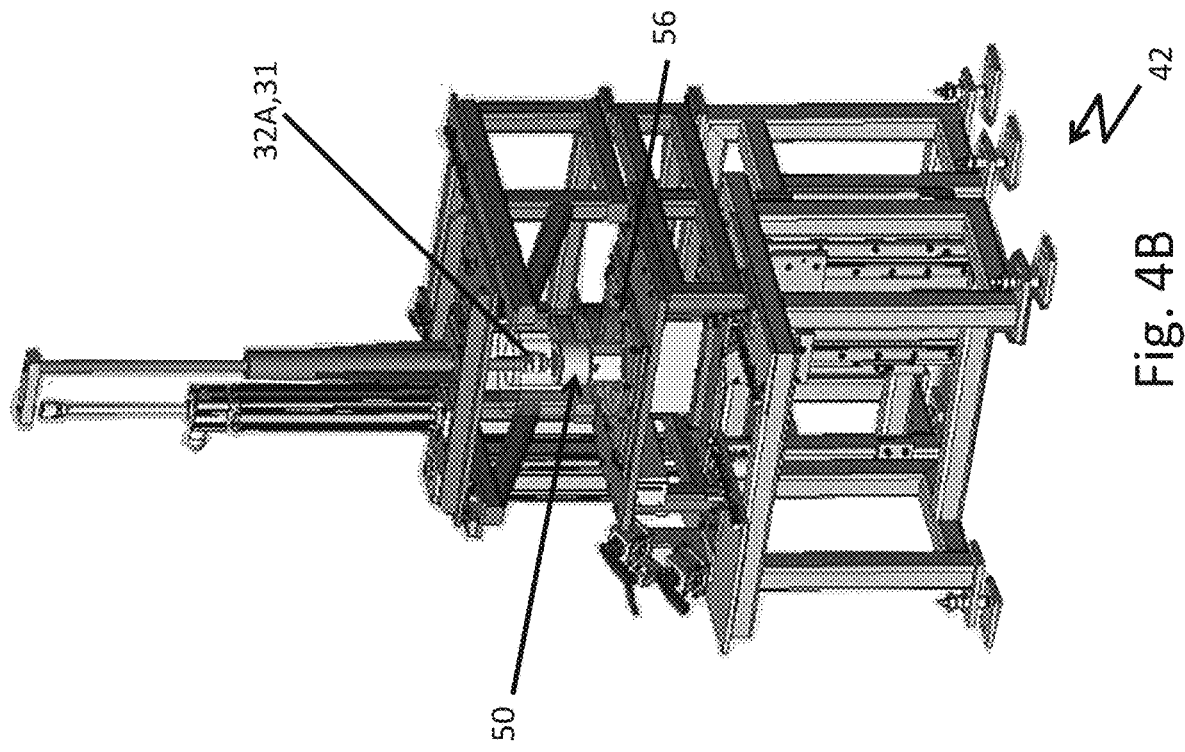
Figure 4A:
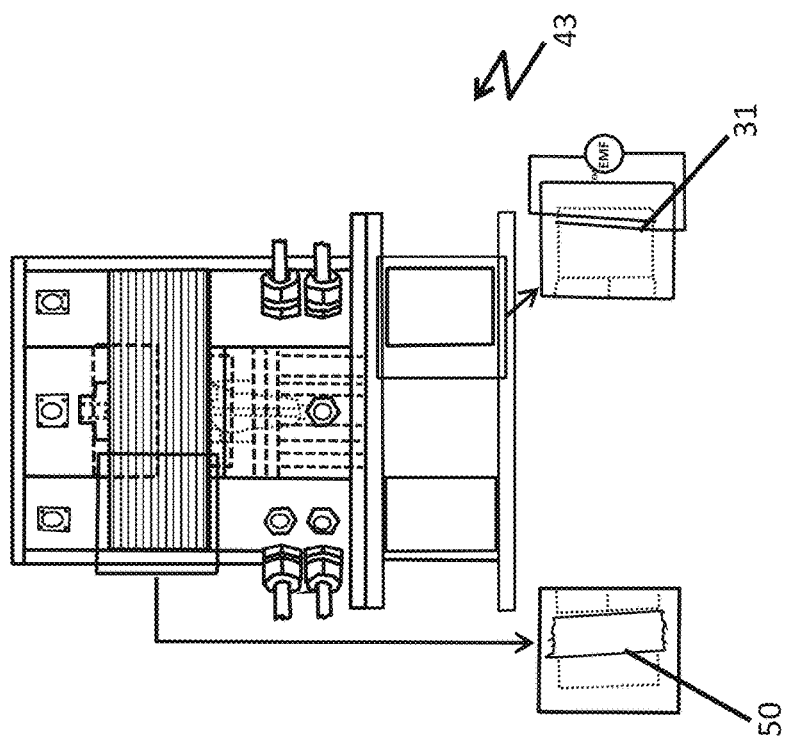

FIG. 4 A is a sketch/schematic of the separated magnetizing and measurement system with components and features noted and FIG. 4 B is an isometric sketch of the manufacturing equipment with components and features noted.

FIGS. 5 A and 5 B are enlarged sketches of the equivalent magnetic circuits for the rotor flux measurement system. FIG. 5 A is the embedded design and FIG. 5 B is the separate air core design.

Figure 6A:
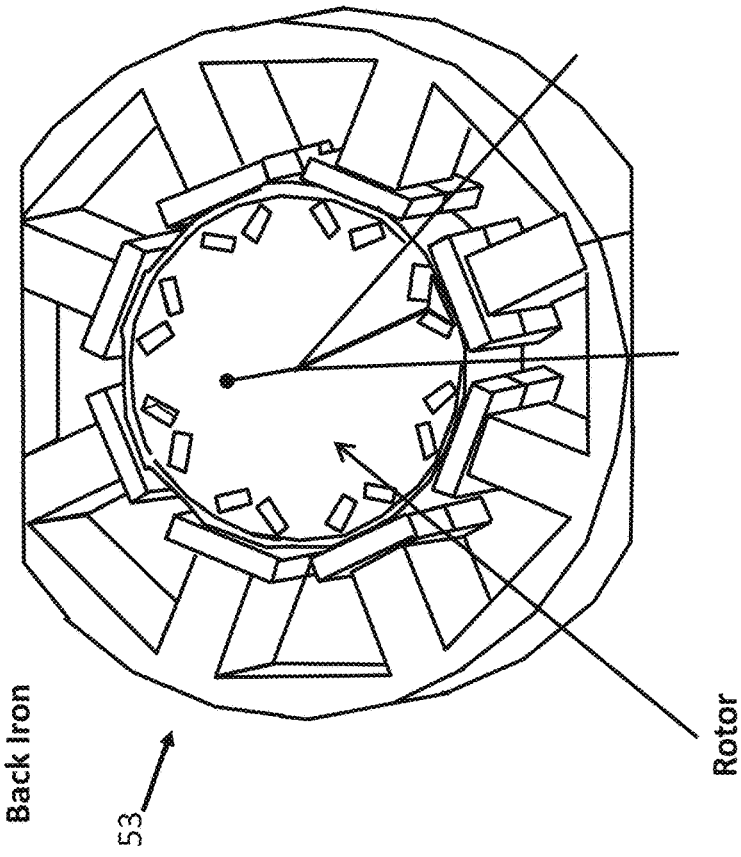
Figure 6B:
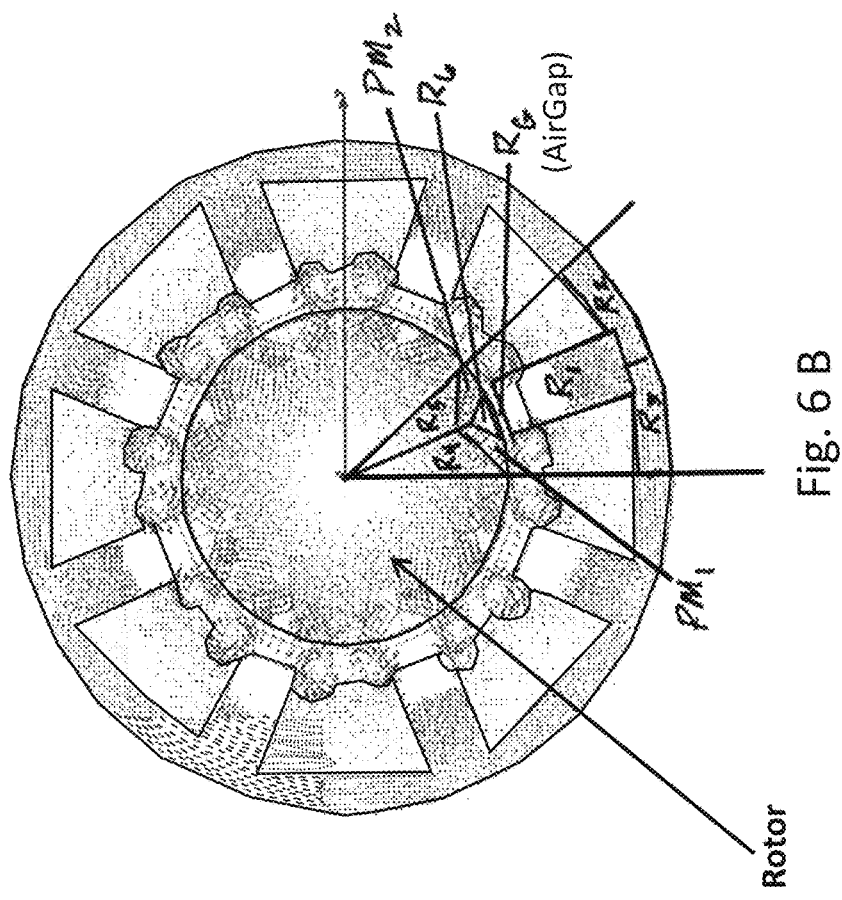
Figure 7C:
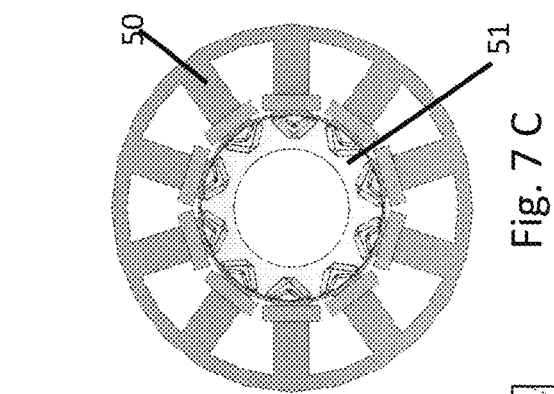
Figure 7B:
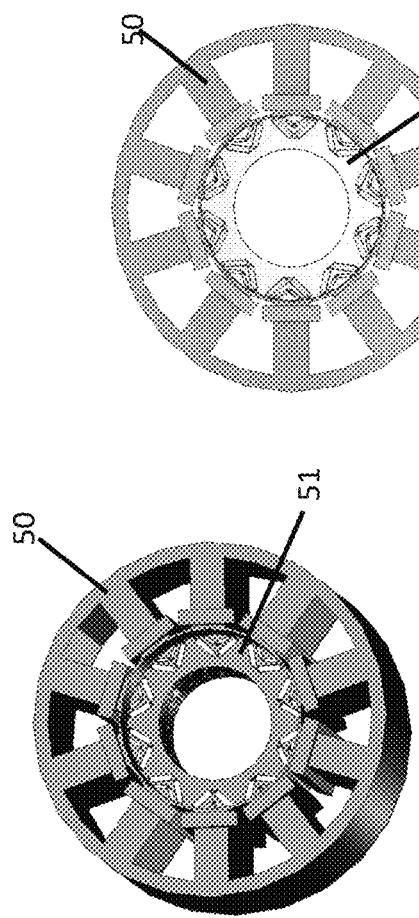
Figure 7E:
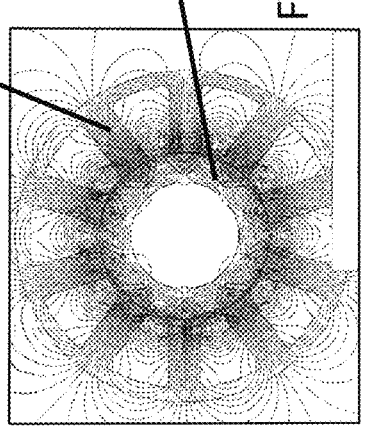
Figure 7F:
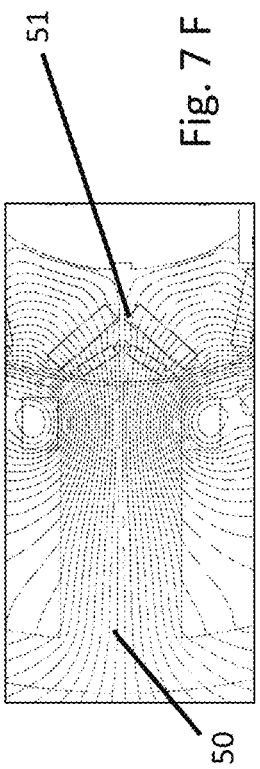
Figure 7A:
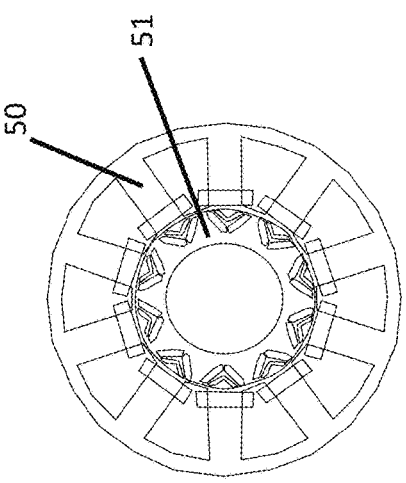
Figure 7D:
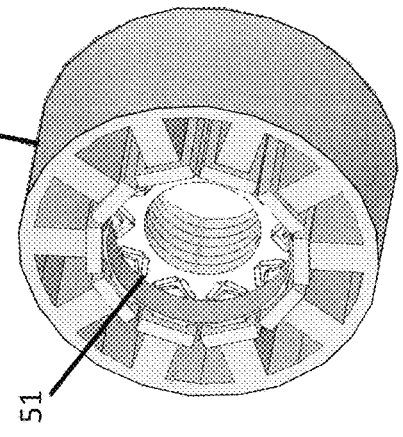

FIGS. 6 A and 6 B are the physical magnetic circuit and the circuit with the reluctance elements shown.

FIGS. 7 A through 7 F are sketches of the physical magnetic circuit and rotor core in place from various perspectives.

Figure 8A:
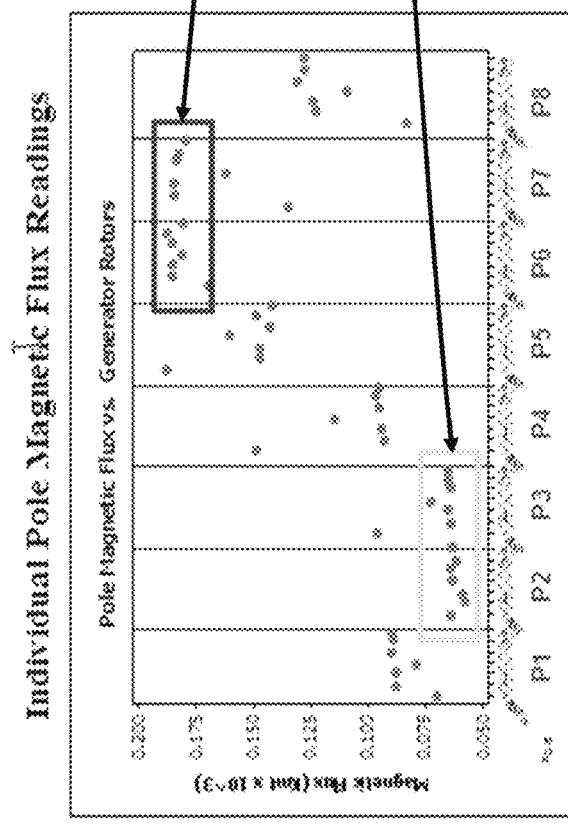
Figure 8B:
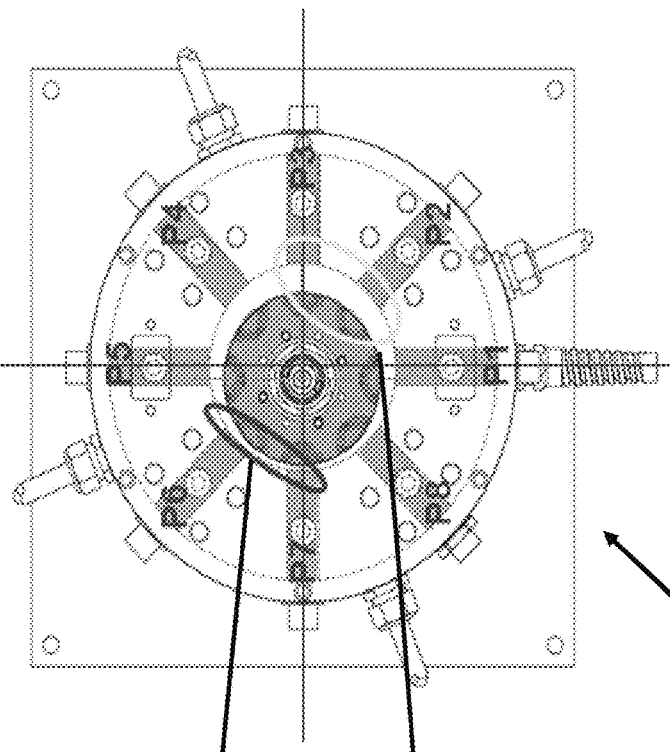

FIGS. 8 A and 8 B are the initial Flux Measurement Results with Embedded Coil shown.

Figure 9:
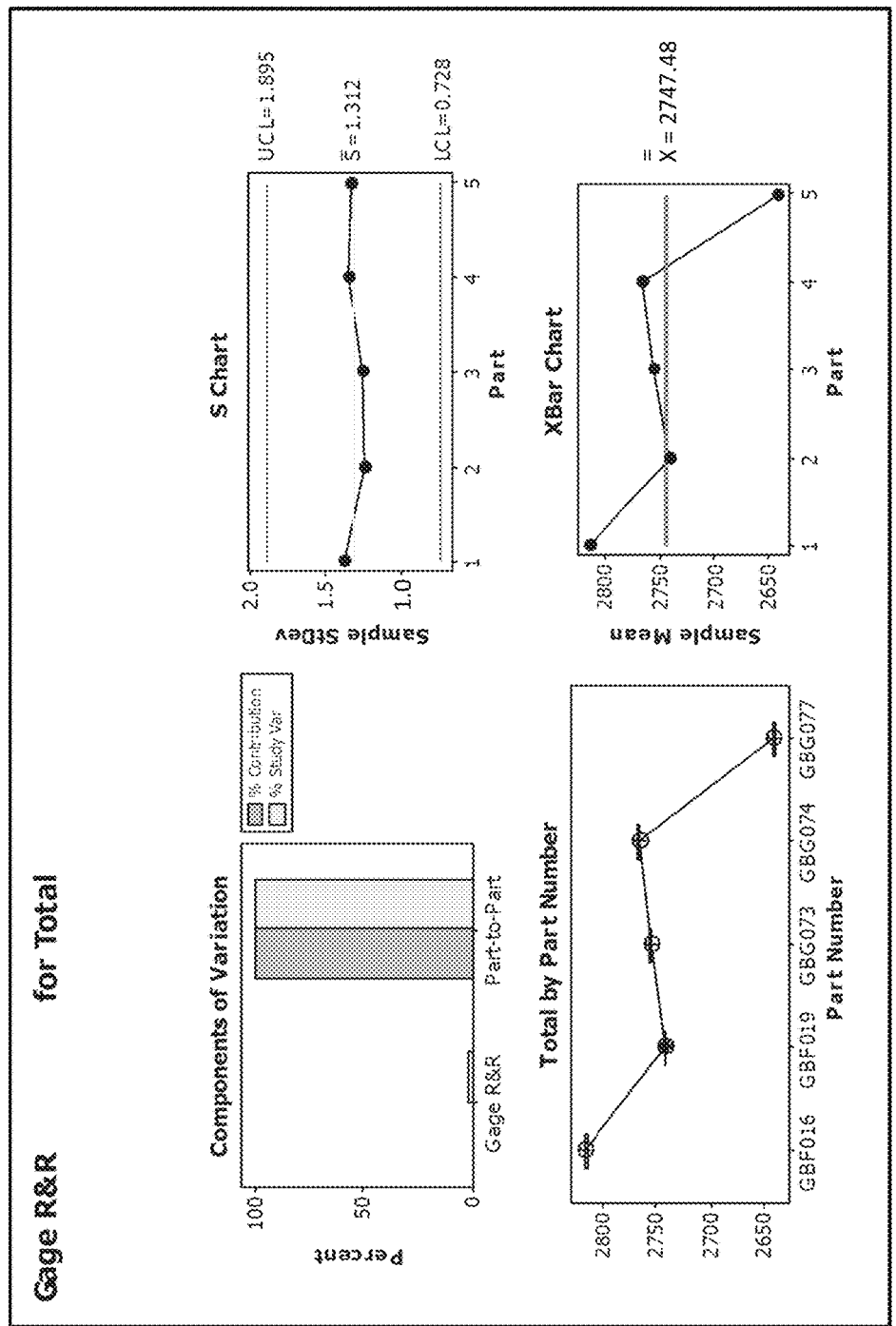

FIG. 9 is a Gage R&R Results for Total Flux across all Poles shown.

Figure 10:
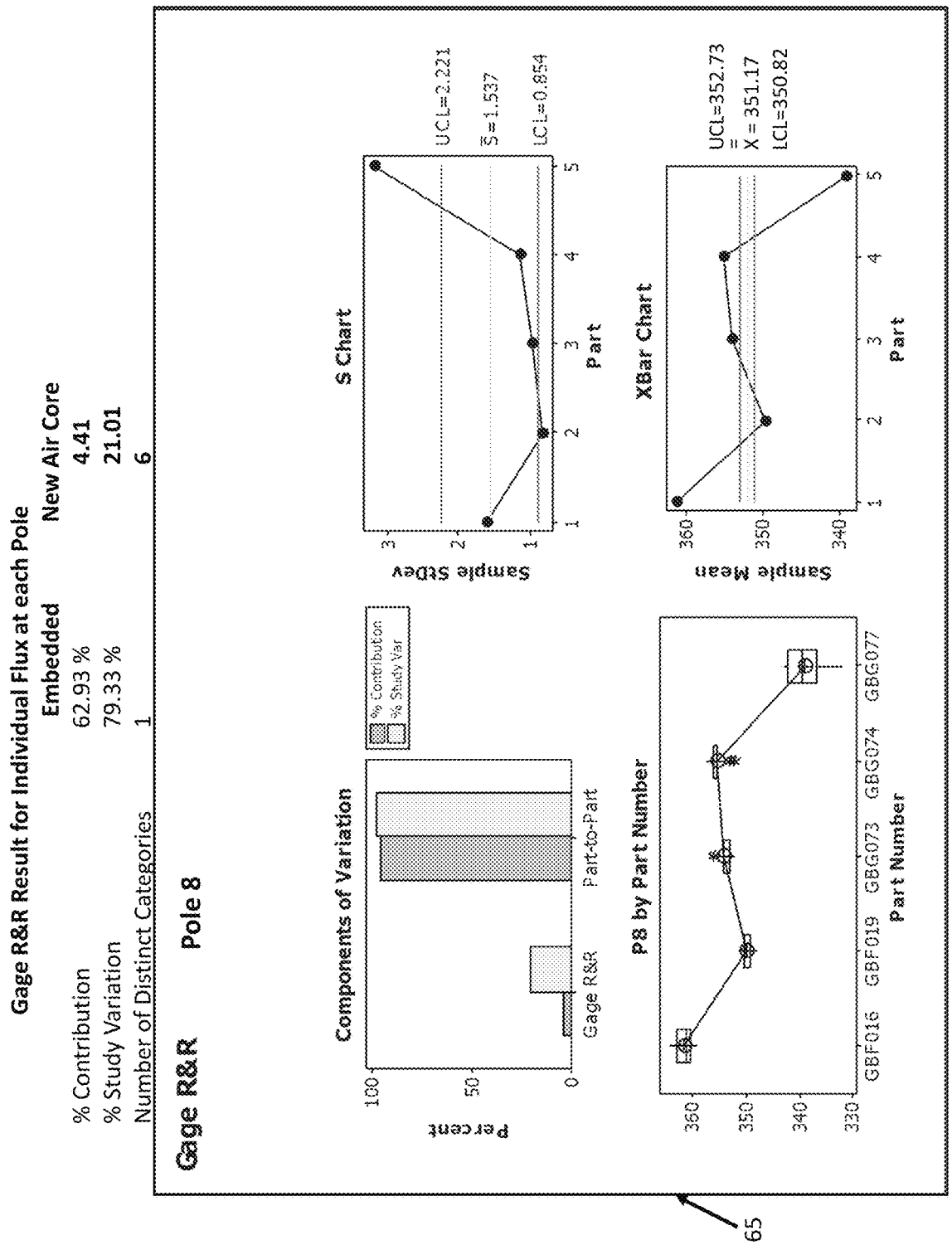

FIG. 10 is a Gage R&R Result for Individual Flux at each Pole shown.

Figure 11:
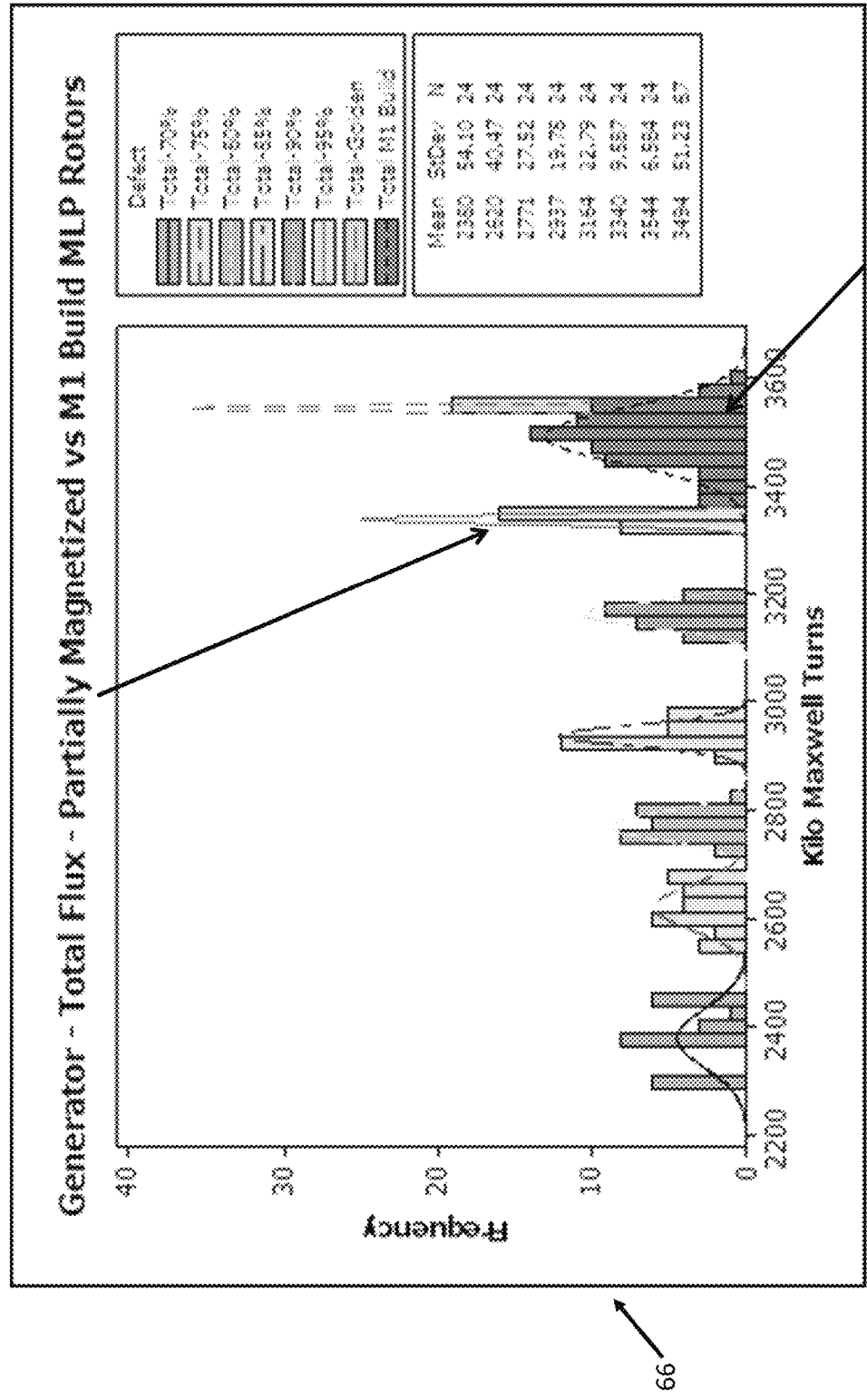

FIG. 11 is Defect Detection Studies and Initial results with the Embedded magnetizer and measuring coils shown.

Figure 12:
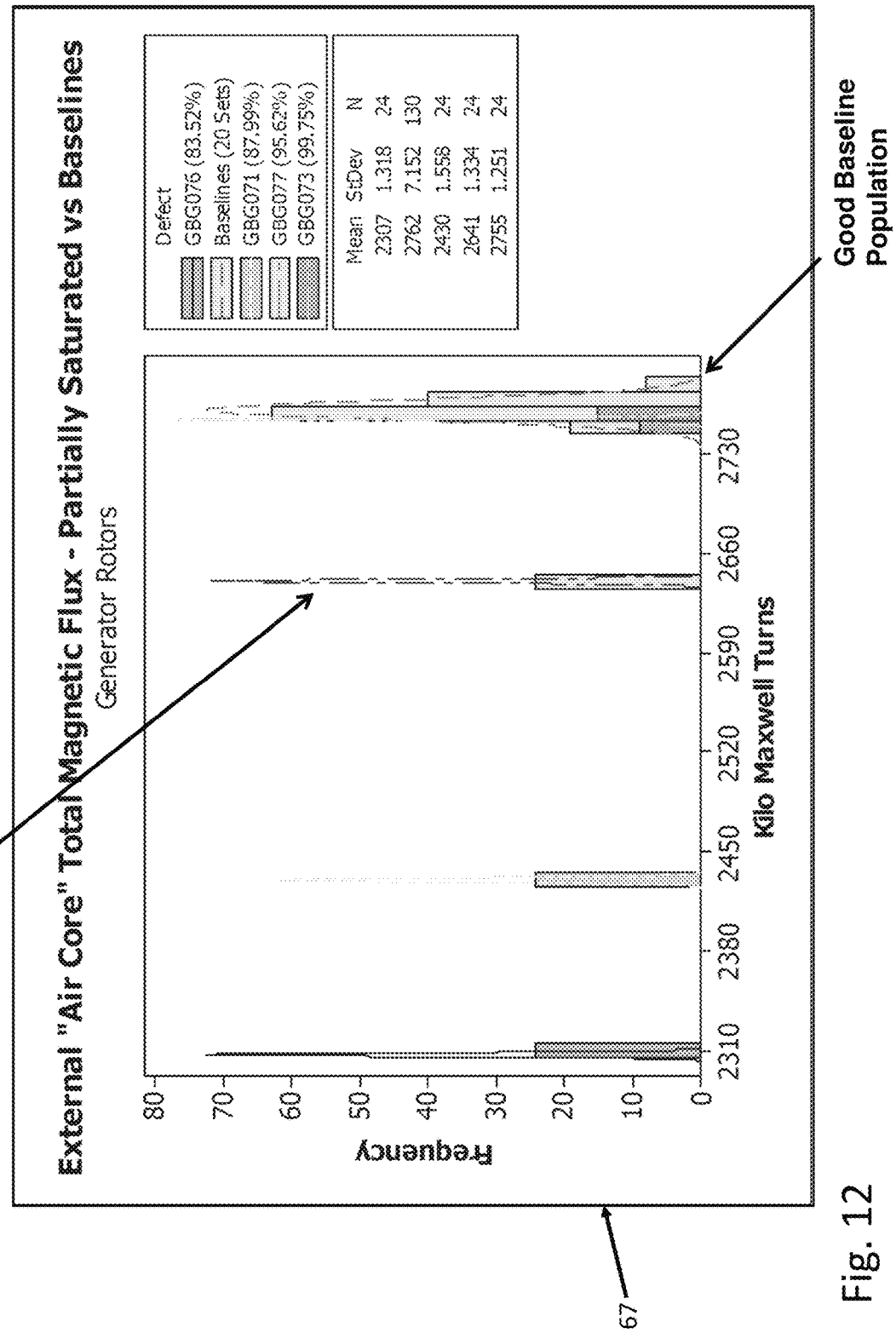

FIG. 12 Defect Detection Studies and the separate new Air Core measuring coil results shown.

FIGS. 13 A and 13 B are top and side views of the Air Core design.

Figure 14:
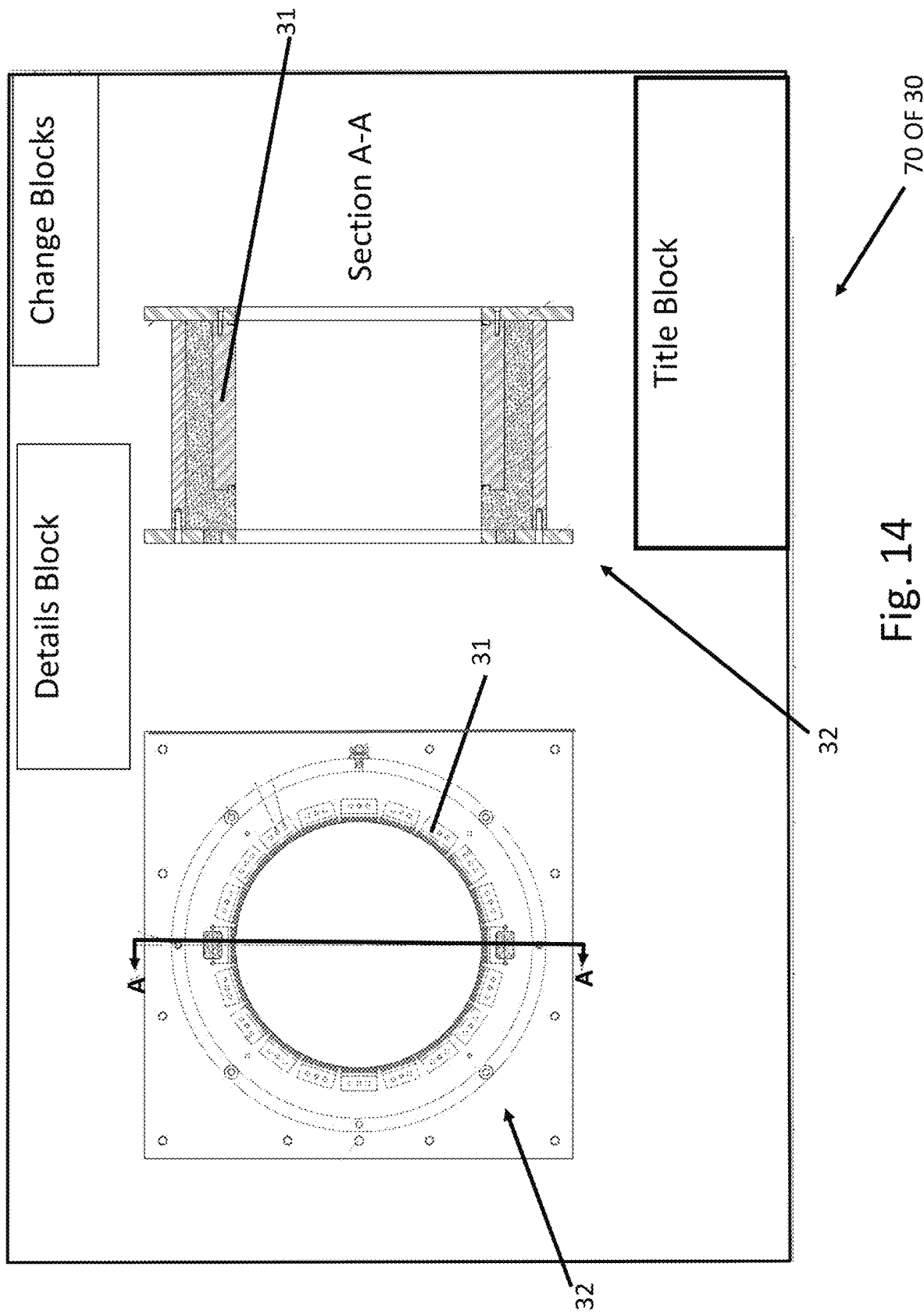

FIG. 14 is the overall design for the new separate air core measurement system shown.

REFERENCE NUMERALS

The following list refers to the drawings:

TABLE B

| Ref # | Description |
|---|---|
| 30 | the external "Air Core" Flux Measurement System/device for a production magnetizing systems 40 |
| 30A | Embedded coil 30A Flux Measurement System/device for a production magnetizing systems 40 |
| 31 | Instrumentation coil 31 |
| 32 | Magnetizing flux gauge 32 and fixture 32A (holds the instrumentation coil 31 and instrumentation controls and output devices.) |
| 32A | Fixture and structure 32A holding the instrumentation coil 31 and instrumentation controls and output devices. Durable and Non-ferromagnetic material such as stainless steel, composite materials, high strength and high temperature resistant plastic, copper, bronze or the like. |
| 37 | Connection to power source 38 and instrumentation 39 |
| 37A | Connection to power source 38 |
| 37B | Connection to instrumentation 39 |

TABLE B-continued

| Ref # | Description |
|---|---|
| 38 | power source 38 high (greater than 240 v) voltage AC, Low voltage AC (less than 240 V) AC or DC voltage |
| 39 | instrumentation 39 |
| 40 | production magnetizing system with an external "Air Core" Flux Measurement System/Process 40 |
| 41 | Schematic 41 of the combined magnetizing 50 and measurement coil 31 system |
| 42 | isometric of the manufacturing equipment 42 |
| 43 | Schematic 43 of the separated magnetizing 50 and measurement coils 31 |
| 44 | equivalent magnetic circuits 44 for the rotor flux measurement system for combined 41 and separate 42 magnetizing and measuring systems |
| 50 | Magnetizing coil 50 of the magnetizing manufacturing system 40 |
| 51 | Rotor 51 to be magnetized |
| 52 | Capacitive discharge magnetizing supply 52 |
| 53 | Magnetizing fixture 53 (holds the magnetizing coil 50 |
| 54 | Chiller system 54 |
| 55 | Electronic switch 55 |
| 56 | Fixture sub-plate 56 |
| 61 | Initial Flux Measurement Results with Embedded Coil 61 |
| 62 | Total Flux across all Poles 62 |
| 63 | Gage R&R Results 63 Total Poles 62 |
| 64 | Individual Flux at each Pole 64 |
| 65 | Gage R&R Results 65 Individual Pole 64 |
| 66 | Defect Detection Studies and Initial results 66 |
| 67 | Defect Detection study 67 with air core 30 |
| 70 | Design detail sheet |
| mmf | magnetomotive forces mmf |
| Φ | magnet flux Φ |
| R | magnetic reluctance R-R1, R2, R3, etc. |
| PM | Permanent Magnet magnetomotive force PM1, PM2 etc. |

DETAILED DESCRIPTION OF PREFERRED EMBODIMENT

The present development is an external "Air Core" Flux Measurement System for a production magnetizing system/device. The present invention relates to an external "Air Core" Flux Measurement System for a production magnetizing system/device. More particularly, the present invention relates to the application of magnetic energies and to the application of the respective energies of a magnetizing coil and measurement system for the efficient production of coils for the automotive and vehicle industry plus the manner, method and system for evaluating the quality of the cores and magnetic charge after magnetization. This invention relates generally to electrical indicators, and more particularly to an air core meter. This invention further relates to an electrical measuring device for measuring a condition of coil windings through which currents are measured and controlled to check and evaluate the force within the magnetic field. Herein the air core gauges are driven by a dedicated circuit which energizes the coils to develop predetermined current levels and compare to a predetermined value. The present invention provides a method and apparatus for the testing of coils with an air core separate from the magnetization step to eliminate errors and other distracting signals inherent to the measurement device when combined with the core magnetizing step.

The advantages for the device are listed above in the introduction. Succinctly the benefits are that the device:

A. Provides Flux Measurement Capability data that demonstrated GR&R correlation to Defect detection linked to realistic Process Failure Modes B. Minimize or eliminate the effect of Temperature resulting from the Charge/Discharge of high current through the Magnetizing Coils C. Minimize or eliminate the effect of Residual Flux bias resulting from the Magnetization cycle D. Minimize or eliminate the effect of Sensitivity to slight Mechanical Fixture Misalignment The preferred embodiment of the external "Air Core" Flux Measurement System/device 30 for a production magnetizing systems 40 comprising: An Instrumentation coil 31 for total magnetic flux measurement, the instrumentation coil 31 being separate from a magnetizing coil 50 in a production magnetizing systems 40; a Magnetizing flux gauge 32 combined with a fixture to hold a rotor (coil) 51 to be measured and the instrumentation; a power connection to power source 38 and control wiring to the instrumentation 39; the power source 38; and the instrumentation 39.

There is shown in FIGS. 1-14 a complete description and operative embodiment of the external "Air Core" Flux Measurement System/device 30 for a production magnetizing system. In the drawings and illustrations, one notes well that the FIGS. 1-14 demonstrate the general configuration and use of this product. The various example uses are in the operation and use section, below.

The accompanying drawings, which are incorporated in and constitute a part of this specification, illustrate an embodiment of the production magnetizing system with an external "Air Core" Flux Measurement System/device 30 that is preferred. The drawings together with the summary description given above and a detailed description given below serve to explain the principles of the system and combination device . . . .

FIGS. 1 A through 1 E are sketches of the general production magnetizing system with an embedded "Air Core" Flux Measurement System/Process 40 (FIG. 1 A); schematic 41 of the embedded and combined magnetizing and measurement system (FIG. 1 B); isometric 42 of the manufacturing equipment (FIG. 1 C); schematic 43 (FIG. 1 D) of the separated magnetizing and measurement system; and the equivalent magnetic circuits 44 (FIG. 1 E) for both the embedded 30A and separate 30 air coil rotor flux measurement system.

Figure 1A:
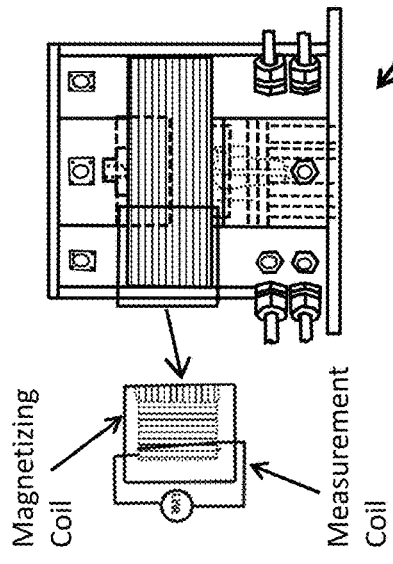
Figure 1B:
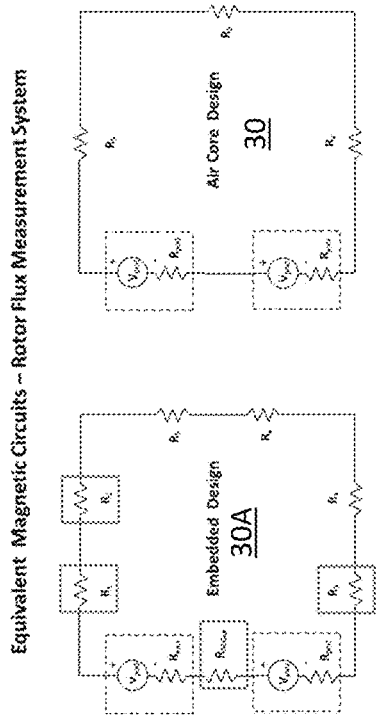
Figure 1C:
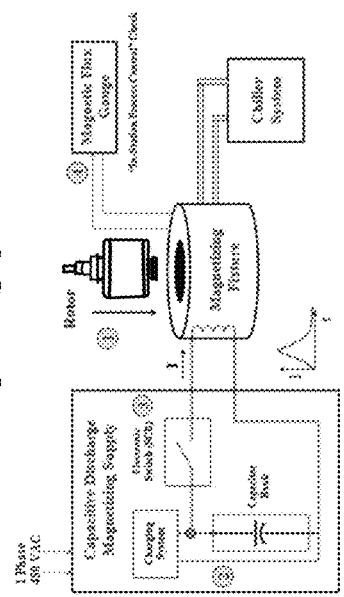
Figure 1D:
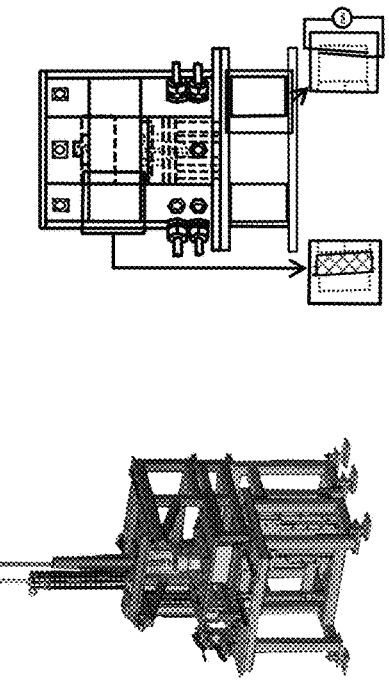
Figure 1E:
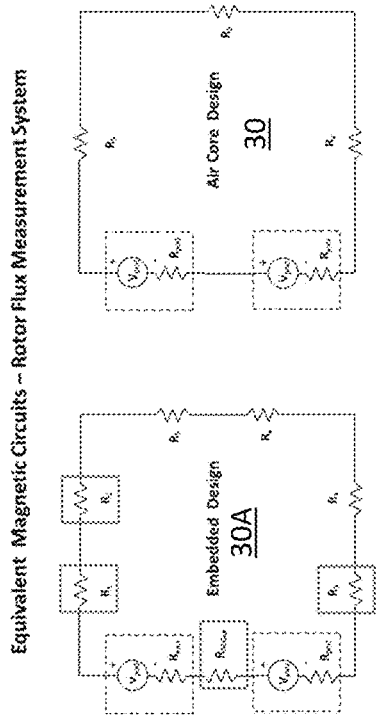
Figure 2:
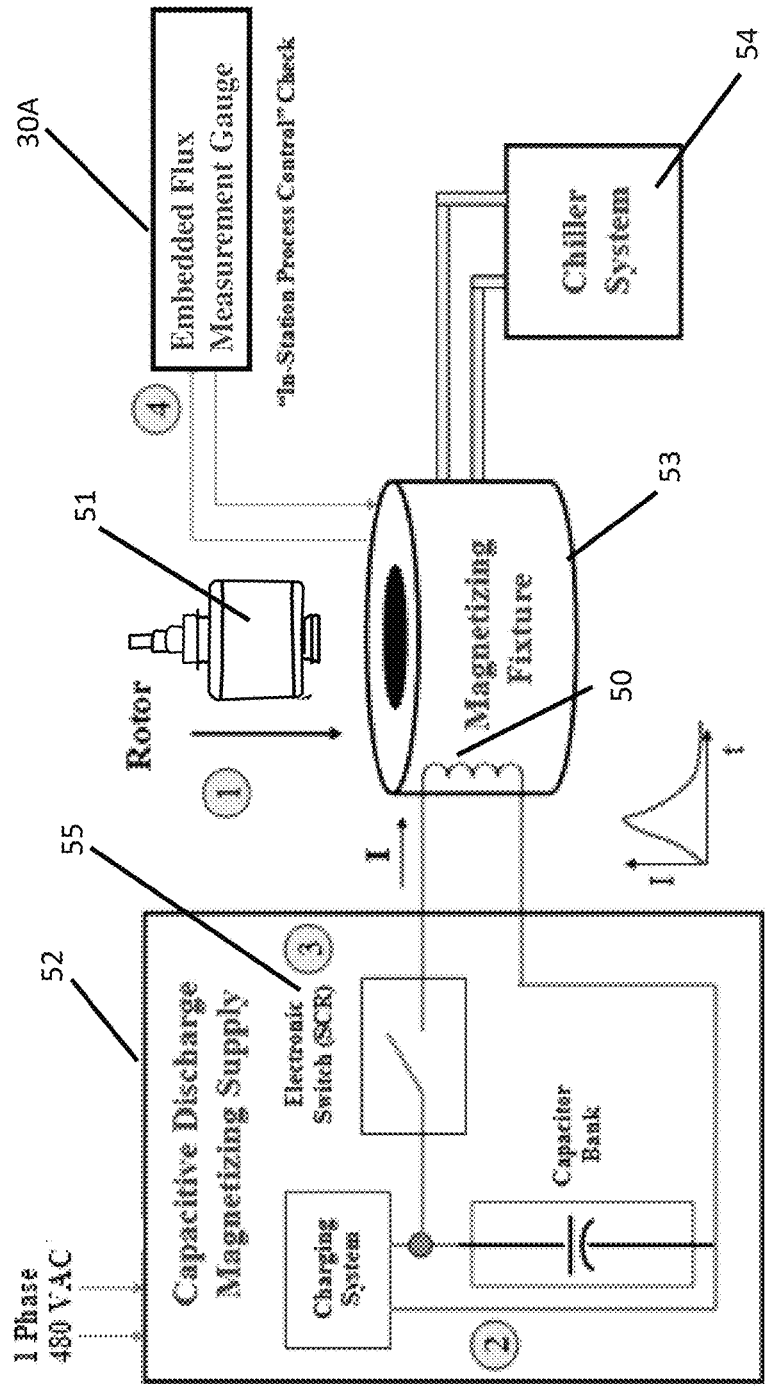
FIG. 2 is a sketch of the production magnetizing system with an embedded Flux Measurement System/Process with components and features noted.

FIG. 2 is a sketch of the production magnetizing system 40 with an external "Air Core" Flux Measurement System/Process 30 with components and features noted. Note the magnetizing coil 50 of the magnetizing manufacturing system 40; rotor 51 to be magnetized; a capacitive discharge magnetizing supply 52; magnetizing fixture 53 (holds the magnetizing coil 50; chiller system 54; electronic switch 55; and the magnetizing flux gauge 32 (holds the instrumentation coil 31). Operation of the production system is described in the below section on operations.

FIG. 3 is a sketch/schematic 41 of the combined magnetizing coil 50 and measurement coil 31 with components and features noted. Here the Embedded Design 41 has both instrumentation coil 31 and magnetizing coil 50 in the same general flux path. The goal for the magnetizing circuit is to maximize flux in order to saturate the magnetic material (of the rotor 51). Small air gaps between the rotor 51 and magnetizing coil 50 and high permeability iron in the magnetic circuit are favorable for maximizing flux for a given amount of energy put into the coils that generate the field. However, small air gaps and iron are not favorable for the measurement coil 31 since there are significant contributors to measurement variation caused by slight differences in air gap. The air gap is the dominating reluctance (magnetic equivalent to resistance) component to the measurement flux when the magnetized rotor is lowered. Small gap differences between poles or across parts due to slight misalignment directly contribute to the measurement. VSA studies indicated that the air gap variation was approximately 40% of the nominal gap required for clearance. Corresponding measurement variation was seen in the results with the embedded coil. [Variation Analysis (VSA) is a powerful dimensional analysis tool used to simulate manufacturing and assembly processes and predict the amounts and causes of variation. A digital prototype is used to create a comprehensive representation of geometry, product variation (tolerances), assembly process variation (sequence, assembly attachment definition, tooling) and measurements. This model is used to predict if there will be any assembly build problems, before any physical parts are made or tooling is cut.]

FIG. 4 A is a sketch/schematic 42 of the separated magnetizing and air core measurement system 30 with components and features noted. This provides an "In Station Flux Measurement Method to Minimize Measurement Variation and Maximize Defect Detection". Air Core Design 30 has the instrumentation coil 31 separated from the magnetizing coil 50. Since the small air gap and iron are not required for the measurement coil 31, the majority of the flux circuit is air. The variation across poles and parts between the rotor 51 and the magnetizing coil 50 do not contribute to the measurement. The signal is further amplified by increasing the number (#) of turns in the winding given the additional space. Also, by removing the measurement coil 31 from the proximity of the magnetizing coil 50, sources of variation from heat transfer and residual magnetism in the iron are eliminated. [Air core—defined as a coil not containing a magnetic core is called an air core coil. This includes coils wound on a plastic or ceramic form in addition to those made of stiff wire that are self-supporting and have air inside them. Air core coils generally have a much lower inductance than similarly sized ferromagnetic core coils but are used in radio frequency circuits to prevent energy losses called core losses that occur in magnetic cores. The absence of normal core losses permits a higher Q factor, so air core coils are used in high frequency resonant circuits, such as up to a few megahertz. However, losses such as proximity effect and dielectric losses are still present. Having no magnetically active core material (an "air core") provides very low inductance in most situations, so a wide range of high-permeability materials are used to concentrate the field. Most high-permeability material are ferromagnetic or ferrimagnetic.]

FIG. 4 B is an isometric sketch 42 of the manufacturing equipment with components and features noted. Shown with the equipment is the magnetizing fixture 53 (holds the magnetizing coil 50 and the fixture sub-plate 56. Internal to the magnetizing fixture 53 are various tooling improvements including improved pins engage and orient Rotor 51 and overhead tooling spears on the rotor shaft. The fixturing and machine design part holding improvements are not part of the instant invention.

FIGS. 5 A and 5 B are enlarged sketches of the equivalent magnetic circuits 44 for the rotor flux measurement system. FIG. 5 A is the embedded design and FIG. 5 B is the separate air core design. Here the embedded and Air Core 30 designs are compared. The magnetomotive forces mmf, magnet flux 43, and magnetic reluctance R are related as mmf=Φ*R where reluctance R is the cumulative reluctance circuit elements R1, R2, R3 etc. With the air core system 30, several of the reluctance (magnetic equivalent to electrical circuit resistance) are eliminated and hence variation removed. The variation minimization provides the measurement significant improvements to the results as will be shown in FIGS. 8 through 12.

FIGS. 6 A and 6 B are the physical magnetic circuit and the circuit with the reluctance elements shown. The analytical explanation to the elimination of the effect of misalignment with the New Air Core design is outlined by the drawings. The reluctance R (resistance losses) from FIGS. 5 A and 5 B are also physically shown. FIG. 6 A is the physical magnetic circuit and FIG. 6 B portrays the reluctance elements R1, R2, R3, etc.

FIGS. 7 A through 7 F are sketches of the physical magnetic circuit/magnetizing coils 50 and rotor core 51 in place from various perspective views. Note the poles of the magnetizing coils 50 provide the field orientation of the flux to the rotor coils 51.

FIGS. 8 A and 8 B are the initial Flux Measurement Results with Embedded Coil shown. FIG. 9 is a Gage R&R Results for Total Flux across all Poles shown. FIG. 10 is a Gage R&R Result for Individual Flux at each Pole shown. FIG. 11 is Defect Detection Studies and Initial results with the embedded magnetizing and measuring coils shown. FIG. 12 Defect Detection Studies and the separate new Air Core measuring coil results shown. These are all discussed in the operations section, below.

FIGS. 13 A and 13 B are top and side views of the Air Core design 30. This is not an "In Station Flux Measurement Method" but a separate measurement coil removed from the general area of the magnetizing coil 50. This removal is to Minimize Measurement Variation and Maximize Defect Detection. Both a top and side view of the magnetizing fixture 32 and coil 31 are shown. The magnetizing flux gauge 32 and fixture holds the instrumentation coil 31 and instrumentation controls and output devices.

FIG. 14 is the overall design for the new separate air core measurement system shown which is not an "In Station Flux Measurement Method to Minimize Measurement Variation and Maximize Defect Detection". Again, a top and side view of the magnetizing fixture 32 and coil 31 are shown. The magnetizing flux gauge 32 and fixture holds the instrumentation coil 31 and instrumentation controls and output devices. Benchmarking revealed the following Industry standard methods and shortfalls with those methods: Employing an Embedded Flux Measuring Coil design that provided an all in one package for Magnetizing and Measuring in a single Casing; Gross overall Flux Measurement across all poles was the primary discriminant for Quality and Correlation to Motor Back EMF and Torque Output and Flux Measurement Capability data was not readily available that demonstrated Gauge R&R, correlation to Defect detection linked to realistic Process Failure Modes. The separate Air coil 30 Measuring concept addressed all these concerns by: A Separate Air Core Flux Measuring design that separates the Measuring Coil from the Magnetizing Coil casing; in depth studies validated that the main sources of variation from the Industry standard 'Embedded' design were:

Temperature resulting from the Charge/Discharge of high current through the Magnetizing Coils.

Residual Flux bias resulting from the Magnetization cycle.

Sensitivity to slight Mechanical Fixture Misalignment. These sources of variation were all minimized or eliminated in the new 'Air Core' design 30.

The details mentioned here are exemplary and not limiting.

Operation of the Preferred Embodiment

The external "Air Core" Flux Measurement System/device 30 for a production magnetizing system has been described in the above embodiment. The manner of how the device operates is described below. One notes well that the description above and the operation described here must be taken together to fully illustrate the concept of the instant device described herein.

The preferred embodiment of the external "Air Core" Flux Measurement System/device 30 for a production magnetizing systems 40 comprising: An Instrumentation coil 31 for flux measurement, the instrumentation coil 31 being separate from a magnetizing coil 50 in a production magnetizing systems 40; a Magnetizing flux gauge 32 combined with a fixture to hold a rotor (coil) 51 to be measured and the instrumentation; a power connection to power source 38 and control wiring to the instrumentation 39; the power source 38 [high (greater than 240 v) voltage AC, Low voltage AC (less than 240 V) AC or DC voltage]; and the instrumentation 39.

FIG. 2 is a sketch of the production magnetizing system 40 with an external "Air Core" Flux Measurement System/Process 30 with components and features noted. Note here the process: Step 1—the rotor 51 is advanced into the magnetizing fixture 53; Step 2—Meanwhile the capacitive discharge magnetizing supply 52 "builds up" power for charging the rotor 51; Step 3—The electronic switch 55 is closed and Step 3.1—the magnetizing current surges through the magnetizing coil 50. Step 3.2—The rotor 51 accepts the EMF and the coil is charged. Step 4—Next the rotor is withdrawn from the Magnetizing coil. Step 5—Then the magnetized/charged rotor is exposed to the magnetic flux gauge 32; Step 5.1—The flux gage 32 has an instrumentation coil 31 to indicate the magnetic flux of the magnetized rotor 51. Depending on the system, the instrumentation and flux gauge is in-station (prior art) or is fixture and built as a separated air coil 30 (new art presented herein) as provided in the new invention, with the accompanying advantages.

FIGS. 8 A and 8 B are the initial Flux Measurement Results 61 with Embedded Coil 30A shown. Initial results revealed clear bias on individual pole readings directly corresponding to slight misalignment between the rotor and magnetizing fixture.

FIG. 9 is a Gage R&R Results 62 for Total Flux across all Poles 62 and the air coil system 30 shown. A significant improvement in Gage R&R was demonstrated for the Total Flux measurement with the new Air Core design.

FIG. 10 is a Gage R&R Result 63 for Individual Flux at each Pole 64 shown. A significant improvement in Gage R&R was demonstrated for the individual pole Flux measurements. This was later determined to be an important measurement for reversed polarity detection. The results for the embedded design were not acceptable.

FIG. 11 is Defect Detection Studies and Initial results 66 with the embedded magnetizer and measuring coils 30A shown. Initial results with the Embedded design 30A was capable of detecting several partially saturated conditions but fell short of reliably detecting a 95% condition which was also determined to be equivalent to a single magnet missing condition. This also permits identifying a missing magnet.

FIG. 12 Defect Detection Studies 67 with air core 30 and the separate new Air Core measuring coil results shown. Subsequent results with the New Air Core design 30 along with tooling improvements demonstrated excellent defect detection capability for all conditions including the 95% partially saturated rotor and missing magnet condition.

With this description it is to be understood that the external "Air Core" Flux Measurement System/device 30 for a production magnetizing system is not to be limited to only the disclosed embodiment of product. The features of the system of the production magnetizing system with an external "Air Core" Flux Measurement System/device 30 are intended to cover various modifications and equivalent arrangements included within the spirit and scope of the description.

Unless defined otherwise, all technical and scientific terms used herein have the same meaning as commonly understood by one of ordinary skills in the art to which these inventions belong. Although any methods and materials similar or equivalent to those described herein can also be used in the practice or testing of the present inventions, the preferred methods and materials are now described. All patents and publications mentioned herein, including those cited in the background of the application, are hereby incorporated by reference to disclose and describe the methods and/or materials in connection with which the publications are cited.

The publications discussed herein are provided solely for their disclosure prior to the filing date of the present application. Nothing herein is to be construed as an admission that the present inventions are not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments can be made and still fall within the scope of the inventions. It should be understood that various features and aspects of the disclosed embodiments can be combined with or substituted for one another in order to form varying modes of the disclosed inventions. Thus, it is intended that the scope of at least some of the present inventions herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention for it to be encompassed by the present claims. Furthermore, no element, component, or method step in the present disclosure is intended to be dedicated to the public regardless of whether the element, component, or method step is explicitly recited in the claims.

The terms recited in the claims should be given their ordinary and customary meaning as determined by reference to relevant entries (e.g., definition of "plane" as a carpenter's tool would not be relevant to the use of the term "plane" when used to refer to an airplane, etc.) in dictionaries (e.g., widely used general reference dictionaries and/or relevant technical dictionaries), commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used herein in a manner more expansive than its ordinary and customary meaning, the term should be given its ordinary and customary meaning plus the additional expansive meaning, or (b) if a term has been explicitly defined to have a different meaning by reciting the term followed by the phrase "as used herein shall mean" or similar language (e.g., "herein this term means," "as defined herein," "for the purposes of this disclosure [the term] shall mean," etc.). References to specific examples, use of "i.e.," use of the word "invention," etc., are not meant to invoke exception (b) or otherwise restrict the scope of the recited claim terms. Other than situations where exception (b) applies, nothing contained herein should be considered a disclaimer or disavowal of claim scope. Accordingly, the subject matter recited in the claims is not coextensive with and should not be interpreted to be coextensive with any particular embodiment, feature, or combination of features shown herein. This is true even if only a single embodiment of the particular feature or combination of features is illustrated and described herein. Thus, the appended claims should be read to be given their broadest interpretation in view of the prior art and the ordinary meaning of the claim terms.

As used herein, spatial or directional terms, such as "left," "right," "front," "back," and the like, relate to the subject matter as it is shown in the drawing FIGS. However, it is to be understood that the subject matter described herein may assume various alternative orientations and, accordingly, such terms are not to be considered as limiting. Furthermore, as used herein (i.e., in the claims and the specification), articles such as "the," "a," and "an" can connote the singular or plural. Also, as used herein, the word "or" when used without a preceding "either" (or other similar language indicating that "or" is unequivocally meant to be exclusive—e.g., only one of x or y, etc.) shall be interpreted to be inclusive (e.g., "x or y" means one or both x or y). Likewise, as used herein, the term "and/or" shall also be interpreted to be inclusive (e.g., "x and/or y" means one or both x or y). In situations where "and/or" or "or" are used as a conjunction for a group of three or more items, the group should be interpreted to include one item alone, all of the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, etc. used in the specification (other than the claims) are understood as modified in all instances by the term "approximately." At the very least, and not as an attempt to limit the application of the doctrine of equivalents to the claims, each numerical parameter recited in the specification or claims which is modified by the term "approximately" should at least be construed in light of the number of recited significant digits and by applying ordinary rounding techniques.

What is claimed is:

1. An external Air Core Flux Measurement System or device (30) for a production magnetizing system (40) comprising:
   a. an instrumentation air coil (31) of a set of various components for flux measurement, the instrumentation air coil (31) being separated and independent from any reluctance imparted from a magnetizing coil (50) in the production magnetizing system (40);
   b. a magnetizing flux gauge (32) combined with a fixturing structure (32A) to hold the separate and independent instrumentation air coil (31);
   c. manufacturing equipment (42,43) that transfers a rotor coil (51) to be measured from the magnetizing coil (50) to the separate and independent instrumentation air coil (31) that is secured by the fixturing structure (32A);
   d. a set of reading instrumentation (39) for providing test data from the instrumentation air coil (31) to a set of several quality tests;
   e. wherein the fixturing structure (32A) is made of durable, non-ferrous and non-magnetic materials that hold the instrumentation air coil (31) and the set of reading instrumentation (39) separated from the magnetizing coil (50);
   f. a connection (37A) to a power source (38) for the magnetizing flux gauge (32) and a connection (37A) to the set of reading instrumentation (39); and
   g. a control wiring to the set of reading instrumentation (39);
   wherein using the external Air Core Flux Measurement System or device (30) to compare flux reluctance measurements of two or more magnetized rotors provides a flux measurement data capability with reduced variation that demonstrates a GR&R correlation to defect detection linked to a realistic process failure mode indicating a missing magnet; minimizes or eliminate an effect of temperature resulting from the charge or discharge of high current through the magnetizing coil (50); and minimizes an effect of residual flux bias resulting from a magnetization cycle.

2. The external Flux Measurement System or device (30) according to claim 1, wherein the set of various components for flux measurement is selected from a group consisting of air with stiff coil wires, plastic cores and ceramic coils.

3. The external Air Core Flux Measurement System or device (30) according to claim 1, wherein the fixturing structure (32A) made of durable materials is a set of various materials selected from group consisting of non-ferromagnetic material, stainless steel, composite materials, high strength and high temperature resistant plastic, copper, and bronze.

4. The external Air Core Flux Measurement System or device (30) according to claim 1, wherein the power source (38) for the magnetizing flux gauge is selected from a group consisting of high (240 V plus) voltage AC, Low voltage AC (<240 V), AC or DC voltage.

5. The external Air Core Flux Measurement System or device (30) according to claim 1, wherein the set of several quality tests is selected from a group consisting of defect detection; Motor Back EMF; Flux Measurement Capability; Gage R&R; reluctance (R) (resistance losses); and Variation Analysis (VSA).

6. An external Air Core Flux Measurement System or device (30) which uses a process comprised of:
   Step 1—a rotor (51) is advanced by manufacturing equipment (42, 43) into a magnetizing fixture (53);
   Step 2 Meanwhile a capacitive discharge magnetizing supply (52) builds up power for charging the rotor (51);
   Step 3—an electronic switch (55) is closed; and
   Step 3.1—magnetizing current surges through a magnetizing coil (50);
   Step 3.2—the rotor (51) accepts the EMF and the magnetizing coil (50) is charged wherein the rotor is now a magnetized or charged rotor;
   Step 4—next the magnetized or charged rotor (51) is withdrawn from the magnetizing coil (50) by a piece manufacturing equipment (42);
   Step 5—next the magnetized or charged rotor is raised by the piece manufacturing equipment (42) and exposed to a magnetic flux gauge (32) with a separate and independent instrumentation air coil (31);
   Step 5.1—the instrumentation air coil (31) to indicate the magnetic flux of the magnetized rotor (51) through a connection (37B) to a flux reading instrumentation (39);
   Step 5.2—the flux reading instrumentation (39) indicates the magnetic flux of the magnetized rotor (51) which is outside of the interference by the separate and independent magnetizing coil (50);
   Step 5.3—the reading of the magnetized rotor (51) by the instrumentation air coil (31) indicated on the reading instrumentation (39) and thereby eliminates all the cumulative reluctance (R) of the separate and independent magnetizing coil (50) and hence reduces variation of the reading by the flux reading instrumentation (39) of the magnetic flux gauge (32) since the flux of the separate and independent magnetizing coil (50) is eliminated;
   wherein using the external Air Core Flux Measurement System or device (30) to compare flux reluctance measurements of two or more magnetized rotors provides a flux measurement capability data capability with reduced variation that demonstrates a GR&R correlation to defect detection linked to a realistic process failure mode indicating a missing magnet; minimizes or eliminate an effect of temperature resulting from the charge or discharge of high current through the magnetizing coil (50); and minimizes an effect of residual flux bias resulting from a magnetization cycle.

* * * * *